United States Patent [19]

Narayan

[11] Patent Number: 5,063,202
[45] Date of Patent: Nov. 5, 1991

[54] HIGH TRANSITION TEMPERATURE SUPERCONDUCTORS

[75] Inventor: Jagdish Narayan, Raleigh, N.C.

[73] Assignee: Kopin Corporation, Taunton, Mass.

[21] Appl. No.: 517,523

[22] Filed: Apr. 27, 1990

Related U.S. Application Data

[63] Continuation of Ser. No. 85,591, Aug. 14, 1987, abandoned.

[51] Int. Cl.[5] .................. H01L 39/12; C01F 17/00; C01G 3/02
[52] U.S. Cl. ........................ 505/1; 252/518; 252/521; 423/263; 423/593; 423/604; 501/123; 501/126; 501/152; 505/780
[58] Field of Search .............. 252/518, 521; 423/263, 423/593, 604; 501/152, 123, 126; 505/1, 780

[56] References Cited

U.S. PATENT DOCUMENTS 4,918,051  4/1990  Mantese et al. ................. 505/1
4,943,557  7/1990  Ling ................................ 505/1

OTHER PUBLICATIONS

Onada et al., *J. Journal of App. Physics*, vol. 26, No. 4, 4/1987, pp. L363-L365.
Oguchi et al., *J. Journal of App. Physics*, vol. 26, No. 4, 4/1987, pp. L417-L419.
Dagam, *Chem. & Eng. News*, May 1987, pp. 7-16.
Jayaraman, *Nature*, vol. 327, Jun. 1987, p. 357.
Huang et al., *Nature*, vol. 328, Jul. 1987, pp. 403-404.
Büttner et al., *Nature*, vol. 329, Oct. 1987, pp. 500.
Chemical Abstract CA 108(20): 178137m RAO et al., *Jpn. J. Appl. Phys.* Part 1, vol. 26 (Suppl. 26-3, Proc. Int. Conf. Low Temp. Phys. 18th, 1987, pt. 2), pp. 1077-1078.
Chemical Abstract CA 108(20): 178144m Olekhnovich et al., *Yesti Akad. Nauk. BSSR, Ser. Fiz. Mat. Nawuk* (6), pp. 47-50, 1987.
Olekhnovich et al., *Vestsi Akademii Navuk Belaruskay SSR Seryya fizika-matematychnykh Navak*, No. 6, 1987, pp. 47-50 (Eng.trans.).
Rao et al., J. Journal of Applied Physics, vol. 26 (1987), Supplement 26-3, pp. 1077-1078.
Qadri et al., *Physical Review B*, vol. 35, No. 13, May 1987, pp. 7235-7237.
J. Narayan et al., *Appl. Phys. Lett.* 51, 940 (1987).
A. Marshall et al., *Phys. Rev. B* 37, 9353 (1988).
J. Narayan et al., *Appl. Phys. Lett.* 51, 1845 (1987).
K. Char et al., *Phys. Rev. B* 38, 834 (1988).
D. Eaglesham et al., *Appl. Phys. Lett.* 51, 457 (1987).
M. Viegers et al., *J. Mater. Res.* 2, 743 (1987).
J. Narayan et al., *Reviews of Solid State Science* 2, 519 (1988).

*Primary Examiner*—Paul Lieberman
*Assistant Examiner*—Linda D. Skaling
*Attorney, Agent, or Firm*—Hamilton, Brook, Smith & Reynolds

[57] ABSTRACT

The phase of the $YBa_2Cu_3O_{9-\delta}$ having a perovskite unit cell structure of approximately the following dimensions a=3.8A, b=3.9A, and c=13.55A has been discovered and identified.

3 Claims, 5 Drawing Sheets

FIG. 2A
FIG. 2B
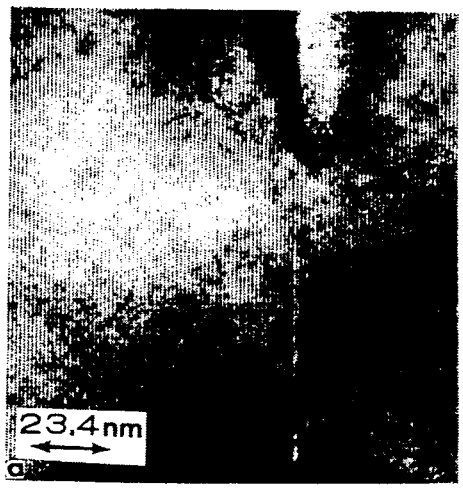
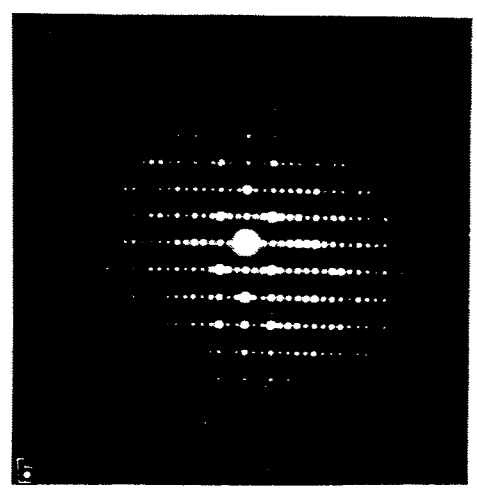
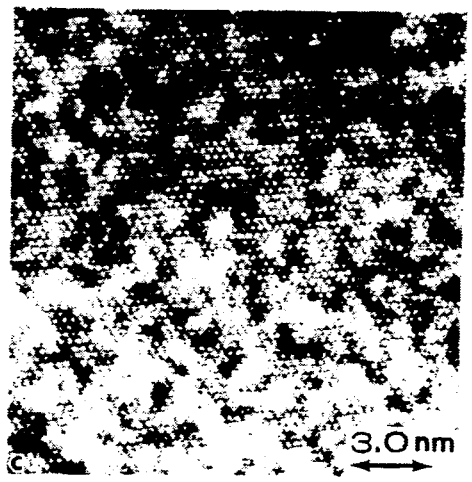
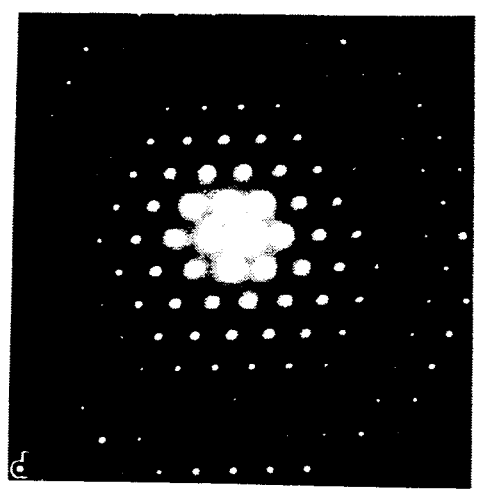
FIG. 2C
FIG. 2D

FIG. 3A
FIG. 3C
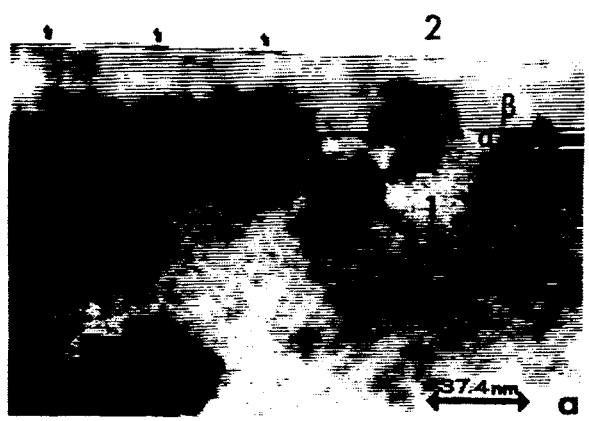
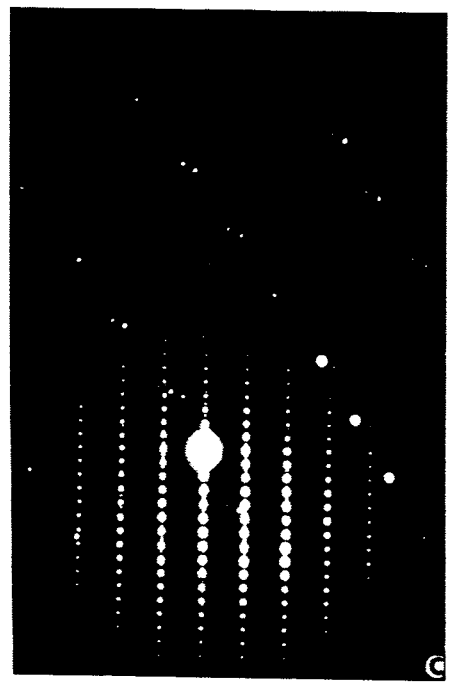
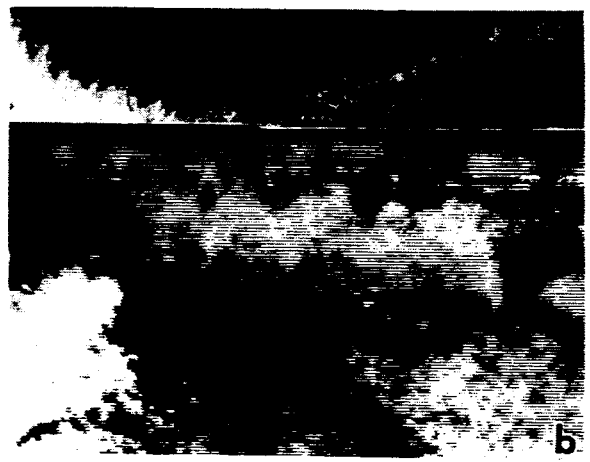
FIG. 3B

HIGH TRANSITION TEMPERATURE SUPERCONDUCTORS

This is a continuation of co-pending application Ser. No. 085,591 filed on Aug. 14, 1987 now abandoned.

1. FIELD OF THE INVENTION

The invention relates to high transition temperature superconductors formed in $YBa_2Cu_3O_{9-\delta}$ and similar chemical systems.

2. DESCRIPTION OF THE PRIOR ART

Superconductivity refers to certain electric and magnetic properties of materials which exist when the materials are cooled to below their "transition" or "critical" temperatures ($T_c$). Superconductor materials have been shown to conduct electrical current with essentially zero resistance. They have also been shown to exclude a magnetic field from their interiors—the Meissner effect.

Superconductivity above 30° K. was first reported in the mixed phase La-Ba-Cu-0 compound system [J. G. Bednorz and K. A Muller, Z. Phys., B64, 189 (1986).] Subsequently, superconducing transition temperatures in the 90° K. range were reported in a single phase $ABa_2Cu_3O_{9-\delta}$, where A=Y,La,Nd,Sm,Eu,Gd,Ho,Er and Lu. [M.K. Wu et al., Phys. Rev. Lett., 58, 908 (1987); P.H. Hor et al., Phys. Rev. Lett., 58, 1891 (1987)]. The $T_c \cong 90°$ K. material has been identified and prepared as a pure superconducting phase which is $YBa_2Cu_3O_{9-\delta}$ ($\delta=2.1\pm0.05$) and has been described as a distorted, oxygen-deficient, tripled perovskite with a crystllographic unit cell of a=3.822Å, b=3.891Å, and c=11.667Å. [Cava et al., Phys. Rev. Lett. 58, 1676 (1987); Hinks et al., Appl. Phys. Lett. 50, 1068 (1987)].

Shortly after the discovery of the $T_c \cong 90°$ K. materials, transition events at higher temperatures were reported by several groups. The materials showing these transition events are reported to contain a mixed phase and seem to exhibit a higher degree of instability with processing variables, particularly temperature cycling during superconductivity measurements.

The search continues for high $T_c$ superconductors, particularly for a "room temperature" superconductor that will revolutionize modern technology by providing resistanceless power transmission, faster integrated circuits, novel electronic devices, levitated trains, new energy storage systems, etc.

SUMMARY OF THE INVENTION

According to the present invention, a new phase in the $YBa_2Cu_3O_{9-\delta}$ chemical system has been prepared and identified. Specimens containing the newly discovered and identified phase were prepared by the heat treatment of a properly proportioned mixture of yttrium oxalate, barium carbonate and copper carbonate. The resulting specimens were analyzed by high resolution and analytical transmission electron microscopy (TEM), x-ray diffractions, Raman scattering and x-ray microanalysis, and superconductivity measurements were made with respect to resistivity and magnetic susceptibility. The specimens were shown to contain two phases. The first phase, also referred to herein as the "Alpha" phase, was identified as an orthorhombic $T_c \cong 90°$ K. phase of $YBa_2Cu_3O_{9-\delta}$ having a distorted, oxygen-deficient, tripled perovskite unit cell with a=3.82Å, b=3.88Å and c=11.68Å. The second phase, also referred to hereinafter as the "Beta" phase, was identified as a phase of $YBa_2Cu_3O_{9-\delta}$ having a unit cell with a "stretched" c dimension (c=13.55Å) and was shown to maintain complete coherency with the Alpha phase in other planes and directions. Specimens containing both the Alpha and Beta phases showed resistive transitions near 290° K., i.e., in the range from about 260° K. to about 300° K. The newly discovered and identified Beta phase is the phase in the Y-Ba-Cu-0 system which is superconductive near 290° K.

In one aspect, the present invention may be defined as a $YBa_2Cu_3O_{9-\delta}$ phase having a perovskite-like unit cell structure of approximately the following dimensions: a=3.8Å, b=3.9Å and c=13.55Å. This newly discovered and identified phase contains relatively more copper and oxygen as compared to the known $T_c \cong 90°$ K. superconductive phase of $YBa_2Cu_3O_{9-\delta}$.

In another aspect, the present invention is defined as a high transition temperature superconductor phase formed in the chemical system $XZ_2Cu_3O_{9-\delta}$ where X is selected from the group consisting of Y,La,Nd,Sm,Eu,Gd,Ho,Er,Lu and Z is selected from the group consisting of Ca,Sr,Ba. This superconductor phase is characterized by an orthorhombic unit cell structure having dimensions a and b which are substantially equal and a stretched dimension c on the order of about 3.5 times that of the dimension of a and b.

In yet another aspect, the invention is defined as a high transition temperature superconductor formed in the chemical system $XZ_2Cu_3O_{9-\delta}$ which has a characteristic orthorhombic unit cell structure defined by an electron diffraction pattern and a corresponding lattice image in which the a-b (basal) plane is coherent with the matrix and the c dimension is on the order of one-sixth greater than that of the unit cells of the matrix.

BRIEF DESCRIPTION OF THE DRAWINGS

The invention will be more fully understood from the following detailed description thereof taken in connection with the accompanying drawings, in which:

FIGS. 2A through 2D are high resolution transmission electron microscopy (TEM) micrographs of the $T_c \cong 90°$ K. Alpha phase of the specimens. FIG. 2A shows lattice images of {001} planes of the Alpha phase. FIG. 2B shows the selected-areadiffraction (SAD) pattern in [001] orientation. FIG. 2C shows atomic images of columns of atoms in [331] orientation. FIG. 2D shows the SAD pattern corresponding to the images shown in FIG. 2C in [331] orientation.

FIG. 3A is a high resolution TEM micrograph of a region of a two-phase specimen illustrating both the $T_c \cong 90°$ K. Alpha phase and the newly discovered and identified Beta phase. FIG. 3A shows lattice images of {001} planes which are directly imaged in the Alpha and Beta phases. FIG. 3C is the SAD pattern corresponding to the images shown in FIG. 3A containing spots from both the Alpha and Beta phases. FIG. 3B is a micrograph similar to that of FIG. 3A, but illustrating a different region of the two-phase specimen.

DESCRIPTION OF THE INVENTION

The description which follows is to be understood as being a broad, teaching disclosure directed to persons of skill in the appropriate arts, and not as limiting upon the present invention.

The two phase $YBa_2Cu_3O_{9-\delta}$ specimens were prepared using reagent grade powders of yttrium oxalate, barium carbonate and copper carbonate, mixed in proper proportions. The mixture was calcined at 900° C. for two hours in air. Pressed pellets were formed and sintered in oxygen at 960° C. for 12 hours and cooled to 300° C. at 1° K./min. to produce a base material. Subsequent heat treatments were done at 550° C. for 16 hours in oxygen and cooled at 1° K./min. to complete preparation of the specimens. Thin films were milled from the specimens by ion milling procedures for use in the studies discussed below.

Figure 1:
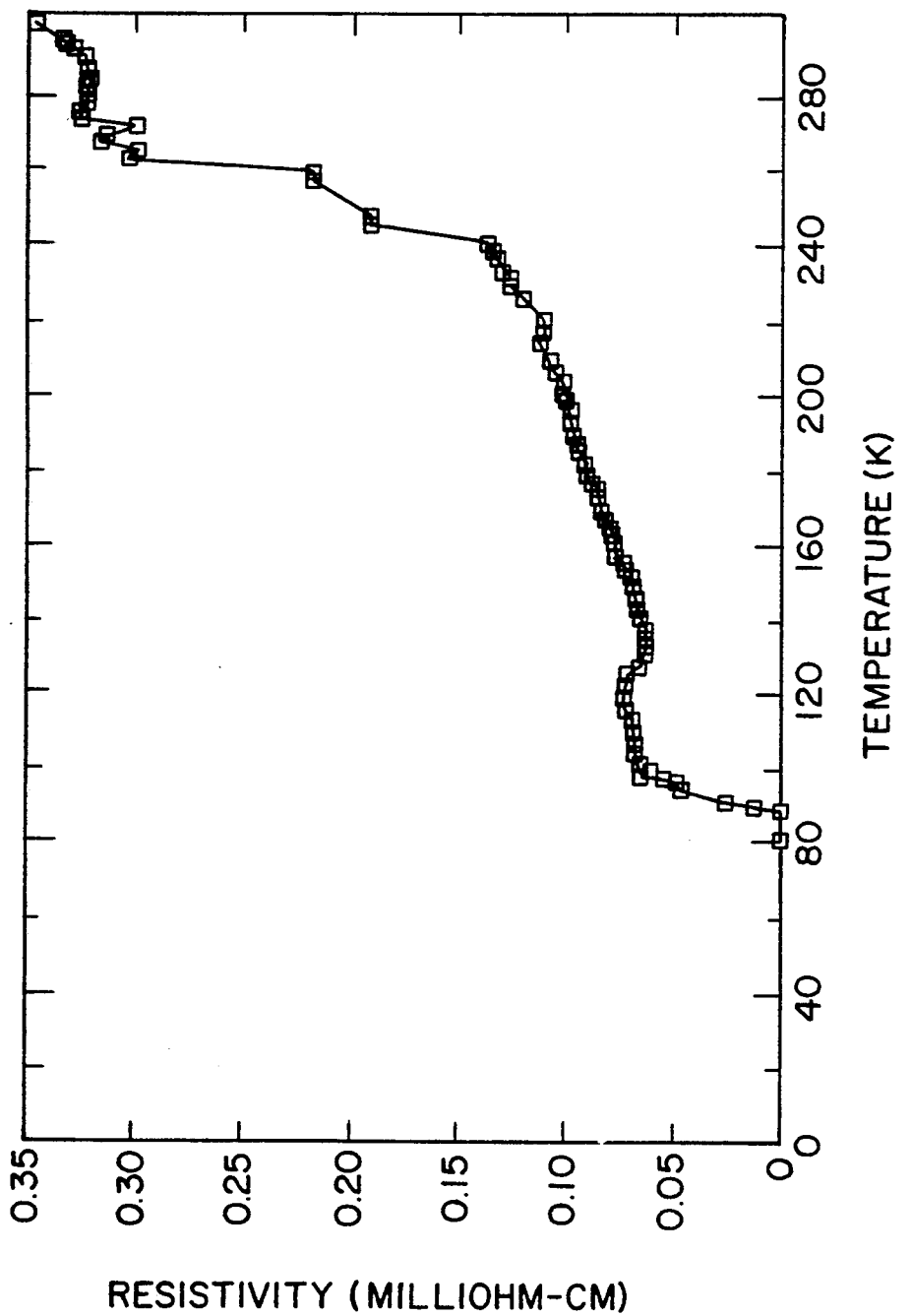
FIG. 1 is a graph plotting resistivity versus temperature for the two-phase $YBa_2Cu_3O_{9-\delta}$ specimens that were prepared by the process described below. The curve of FIG. 1 shows transitions at approximately 290° K., 260° K. and 90° K.

FIG. 1 shows a plot of resistivity versus temperature below 300° K. as obtained by testing the two phase specimens. The resistivity of the specimens drops precipitously from 350 $\Omega$-cm to 120 $\Omega$-cm between 298° and 240° K., followed by an approximately linear decrease, and then the drop to zero resistance at 90° K. (It should be noted that the initial (298° K.) resistivity of 350 $\Omega$-cm in these specimens is much smaller as compared to that of Y-Ba-Cu-O materials previously reported in the literature.)

FIGS. 2A–2D show TEM images of the $T_c \approx 90°$ K. Alpha phase which is the predominant phase in the specimens. FIG. 2A is a lattice image of c-planes {001}. By analysis of the fringe spacing, the separation of lattice planes was determined to be 11.70Å.

The diffraction pattern shown in FIG. 2B shows that the intensity associated with (003) planes is significantly higher than with (001) and (002) planes. This was found to be consistent with theoretical predictions of diffraction intensity.

The high-resolution TEM micrograph and associated selected-area-diffraction pattern for [331]orientation are shown in FIGS. 2C and 2D, respectively. The [331]orientation can access all three, a-, b- and c-axes. From the angles between the diffraction spots (60.2, 59.4, 60.4), it was deduced that for the Alpha phase a=3.82Å, b=3.88Å, and c=11.70Å, which is approximately 3.0 times the a and b dimensions. A high concentration of antiphase twin domains was observed in the Alpha phase, the separation of which changed from 100 to 1500Å in both the Alpha phase and Beta phase materials.

The description will now turn to a discussion of the characteristics of the second phase of the specimens, the newly discovered and identified Beta phase. This phase coexists with the normal orthorhombic Alpha phase, as described above. The electron micrographs of FIGS. 3A and 3B were obtained by making the electron beam parallel to [100] direction, as shown by the diffraction pattern in FIG. 3C. The electron diffraction pattern contains spots from the orthorhombic phase (Alpha), the new phase (Beta), and the adjacent grain (2). The two grains are separated by a large-angle tilt boundary in which the presence of dislocations is indicated by arrows 12. The micrograph in FIG. 3A clearly shows the presence of two phases and that the new Beta phase and the orthorhombic Alpha phase are separated by an atomically sharp boundary. From the spacing of the) {001} planes, dimension c for the Beta phase was directly determined to be 13.55Å, compared to 11.70Å for the orthorhombic Alpha phase. It was determined that $a \approx 3.8$Å and $b \approx 3.9$Å. Thus, the unit cell structure of the superconductor phase of the invention has a "stretched" c dimension that is on the order of about 3.5 times that of the substantially equal dimensions a and b. As compared to the Alpha phase, which is the known orthorhombic $T_c \approx 90°$ K. matrix material upon which the Beta phase of the two phase specimens is grown, the c dimension of the near 290° K. Beta phase is on the order of one-sixth greater than that of the Alpha phase. The unit cell of the Beta phase may generally be referred to as "orthorhombic" or, more particularly, as a "perovskite-like" unit cell. In this sense, the term "perovskite-like" means that the unit cell has certain perovskite features, while it may be distorted due to oxygen-deficiency or other factors and its c dimension is substantially greater than its a and b dimensions.

The micrographs of FIGS. 3A, 3B and 3C show that the new Beta phase maintains a complete coherency with the orthorhombic Alpha phase, with the a-b (basal) plane being coherent with the matrix. As discussed below, the Beta phase of the two phase specimens is metastable. However, its coherency with the Alpha phase indicates its suitability for thin film deposition in stable form.

It has been observed that the generation of dislocations and stacking faults destroys the new Beta phase. This may explain the instability aspect of the new phase as a result of temperature cycling. FIG. 3B clearly shows the presence of many dislocations near the boundary of the new Beta phase and the orthorhombic Alpha phase. The new Beta phase is often observed to run along the grain boundaries. This may explain the observed superconducting properties in terms of connectivity and the lack thereof.

Figure 5:
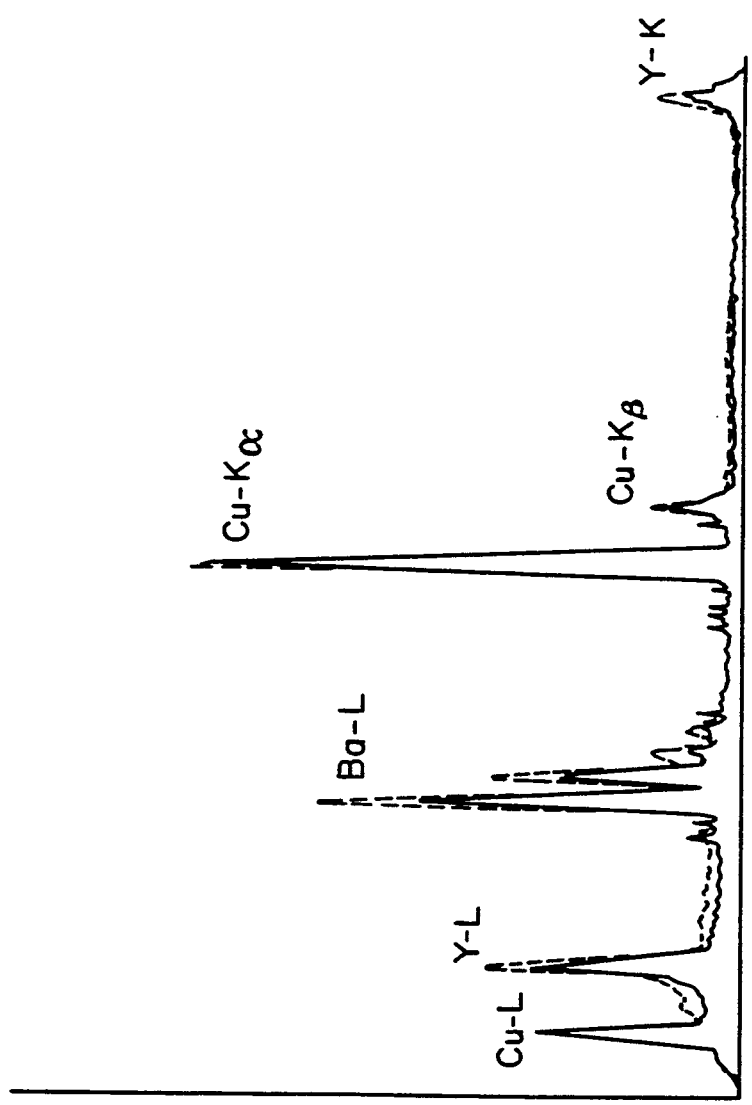
FIG. 5 is a plot of x-ray intensity for both the Alpha and Beta phases.

FIG. 5 shows x-ray spectra of both the Alpha phase (dashed lines) and Beta phase (solid lines). A comparison of the spectra illustrates a relatively high concentration of copper in the Beta phase. The increase in the amount of the copper relative to the amount of yttrium and barium indicates that the Beta phase has the composition $YBa_2Cu_4O$.

Figure 4A:
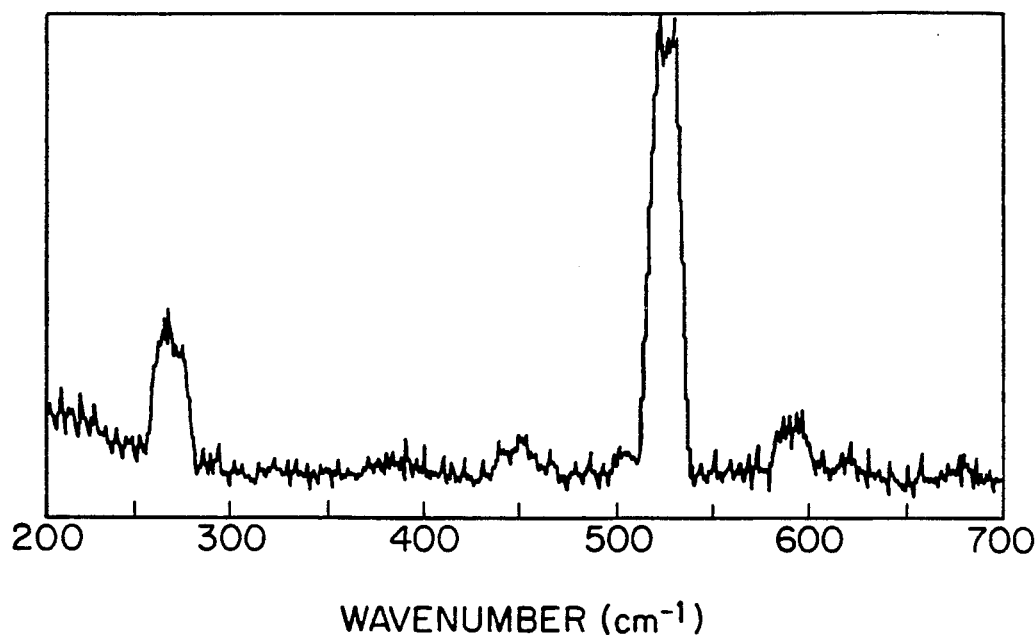
FIG. 4A is a Stokes Raman scattering spectrum obtained using 50 mW of 514.5 excitation of the Alpha phase of the specimen showing a sharp transition at $T_c \cong 90°$ K.
Figure 4B:
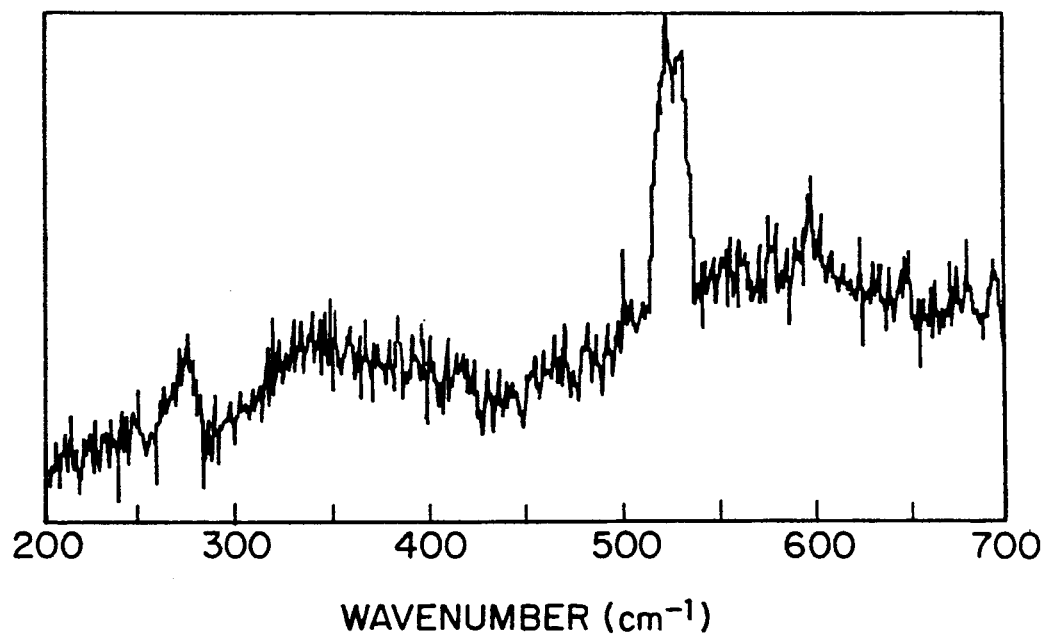
FIG. 4B is a Stokes Raman scattering spectrum obtained using 50 mW of 514.5 excitation of a specimen which contains both the Alpha and Beta phases.

Raman scattering studies were carried out below and above $T_c$ on several high $T_c$ superconducting materials to determine Raman active lattice vibrations. The Raman spectra provide excellent characteristic signatures containing lattice vibrations for different materials. FIGS. 4A and 4B show a comparison of Raman spectra at $T > T_c$ between (i) a sample orthorhombic $T_c \approx 90°$ K. phase material and (ii) the new material containing both the Alpha and Beta phases. In addition to primary peaks at 525 and 65 cm$^{-1}$ (FIG. 4B), the new material containing both Alpha and Beta phases displays a broad peak near 350 cm$^{-1}$. The extra scattering in FIG. 4B is due to the presence of lattice strains and the presence of the new Beta phase in the two-phase specimen. The x-ray diffraction pattern from the two-phase specimen shows characteristic lines corresponding to the orthorhombic Alpha phase, in addition to line broadening and a few weak lines that could not be indexed consistently. This may reflect the presence of lattice strains and the relatively small volumes of the new phase.

By way of summary, the two phase $YBa_2Cu_3O_{9-\delta}$ materials exhibit resistive transitions near 290° K. and contain a new Beta phase in addition to the orthorhombic Alpha phase. The new Beta phase is present in smaller volume fraction compared to the parent orthorhombic Alpha phase. The new Beta phase has $c=13.55Å$ and grows epitaxially on $\{100\}$ planes of the parent Alpha phase. The new phase contains higher strain free energy and is susceptible to being converted by nucleation of dislocations into the parent phase. The new phase can be stabilized in the form of thin film superlattices or by preventing the nucleation of defects in the bulk phase.

While the present invention has been described in connection with a particular example and embodiments, the closely related near 290° K. superconductivity phases in related chemical systems are within the true spirit and scope of the invention. More particularly, near 290° K. superconductor materials of the present invention may be characterized as those 290° K. superconductor materials in the $XZ_2Cu_3O_{9-\delta}$ chemical system wherein X is selected from the group consisting of Y,La,Nd,Sm,Eu,Gd, Ho,Er,Lu and Z is selected from the group consisting of Ca,Sr,BA. In one aspect, in this $XZ_2Cu_3O_{9-\delta}$ chemical system, the present invention may be defined as the near 290° K. superconductor phase with an orthorhombic unit cell structure having dimensions a and b which are substantially equal and a stretched dimension c on the order of about 3.5 times that of the dimension of a and b. The invention may also be characterized as an $XZ_2Cu_3O_{9-\delta}$ phase having a transition temperature near 290° K., wherein the phase is grown epitaxially in a metastable condition on a stable substrate of similar chemical formulation and wherein the superconductor phase is further characterized by its suitability for thin film deposition due to its coherence with the substrate.

That which is claimed is:

1. The compound $YBa_2Cu_4O_{10}$. wherein is such that said compound has a perovskite-like unit cell structure of approximately the following dimensions $a=3.8Å$, $b=3.9Å$, and $c=13.55Å$.

2. A superconductive material comprising a first phase of $YBa_2Cu_3O_{9-\delta}$ wherein is $2.1\pm0.05$ an approximate unit cell structure such that $a\simeq3.82Å$, $b\simeq3.88Å$ and $c\simeq11.68Å$, and further comprising a second phase of $YBa_2Cu_4O_{10}$. wherein is such that said second phase has an approximate unit cell structure such that $a\simeq3.8Å$, $b\simeq3.9Å$ and $c\simeq13.55Å$.

3. The superconductive material of claim 2 further comprising dislocations along a boundary between the first phase and the second phase.

* * * * *

UNITED STATES PATENT AND TRADEMARK OFFICE
CERTIFICATE OF CORRECTION

PATENT NO. : 5,063,202
DATED : November 5, 1991
INVENTOR(S) : Jagdish NMN Narayan It is certified that error appears in the above-indentified patent and that said Letters Patent is hereby corrected as shown below:

COLUMN 6,

In Claim 1, line 12, change "$YBa_2Cu_4O_{10-}$" to ---$YBa_2Cu_4O_{10-\gamma}$--- and insert ---$\gamma$--- after "wherein".

In claim 2, line 17, change "$YBa_2Cu_3O_9-$ wherein is 2.1+0.05" should read --$YBa_2Cu_3O_9-$ wherein is 2.1+0.05 having--.

In Claim 2, line 21, change "$YBa_2Cu_4O_{10-}$" to ---$YBa_2Cu_4O_{10-\gamma}$--- and insert ---$\gamma$--- after "wherein".

Signed and Sealed this

Twenty-sixth Day of October, 1993

*Attest:*

BRUCE LEHMAN

*Attesting Officer*  Commissioner of Patents and Trademarks